(12) United States Patent
Jo et al.

(10) Patent No.: US 9,123,623 B2
(45) Date of Patent: Sep. 1, 2015

(54) SEMICONDUCTOR LIGHT EMITTING DEVICE HAVING MULTI-CELL ARRAY AND METHOD OF MANUFACTURING THE SAME

(71) Applicant: SAMSUNG ELECTRONICS CO., LTD., Suwon-si, Gyeonggi-do (KR)

(72) Inventors: Su Hyun Jo, Gyeonggi-do (KR); Jong Ho Lee, Gyeonggi-do (KR); Jin Hyun Lee, Gyeonggi-do (KR); Chan Mook Lim, Gyeonggi-do (KR); Jin Hwan Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/933,887

(22) Filed: Jul. 2, 2013

(65) Prior Publication Data

US 2014/0008665 A1    Jan. 9, 2014

(30) Foreign Application Priority Data

Jul. 5, 2012   (KR) ................. 10-2012-0073511

(51) Int. Cl.
| | |
|---|---|
| *H01L 29/15* | (2006.01) |
| *H01L 27/15* | (2006.01) |
| *H01L 33/00* | (2010.01) |
| *H01L 33/20* | (2010.01) |

(52) U.S. Cl.
CPC .............. *H01L 27/15* (2013.01); *H01L 27/156* (2013.01); *H01L 33/005* (2013.01); *H01L 33/20* (2013.01); *H01L 2933/0016* (2013.01)

(58) Field of Classification Search
CPC ..................... H01L 21/02458; H01L 21/0254; H01L 29/1608; H01L 29/66068
USPC .......................................... 257/76, 88; 438/33
See application file for complete search history.

(56) References Cited

U.S. PATENT DOCUMENTS

| | | | | |
|---|---|---|---|---|
| 6,995,399 | B2* | 2/2006 | Abe et al. .......................... | 257/79 |
| 2003/0160256 | A1* | 8/2003 | Durocher et al. ............... | 257/88 |
| 2004/0048409 | A1* | 3/2004 | Biwa et al. ....................... | 438/46 |

FOREIGN PATENT DOCUMENTS

| | | |
|---|---|---|
| JP | 2004-079867 A | 3/2004 |
| KR | 2011-0049641 A | 5/2011 |
| KR | 2011-0095772 A | 8/2011 |
| KR | 2011-0123118 A | 11/2011 |

* cited by examiner

*Primary Examiner* — Jami M Valentine
(74) *Attorney, Agent, or Firm* — McDermott Will & Emery LLP

(57) ABSTRACT

A method of manufacturing a semiconductor light emitting device having a multi-cell array, including: sequentially forming a first conductive semiconductor layer, an active layer and a second conductive semiconductor layer on a substrate; etching and removing portions of the second conductive semiconductor layer and the active layer so as to expose portions of an upper surface of the first conductive semiconductor layer corresponding to respective regions of the second conductive semiconductor layer spaced apart from one another; and separating light emitting cells by partially etching the exposed portions of the first conductive semiconductor layer, wherein the separating of the light emitting cells is not performed at an edge portion of the substrate.

13 Claims, 5 Drawing Sheets

SEMICONDUCTOR LIGHT EMITTING DEVICE HAVING MULTI-CELL ARRAY AND METHOD OF MANUFACTURING THE SAME

CROSS-REFERENCE TO RELATED APPLICATION

This application claims the priority of Korean Patent Application No. 10-2012-0073511 filed on Jul. 5, 2012, in the Korean Intellectual Property Office, the entire disclosure of which is incorporated herein by reference.

BACKGROUND OF THE DISCLOSURE

1. Field of the Disclosure

The present disclosure relates to a semiconductor light emitting device and a method of manufacturing the same.

2. Description of the Related Art

In general, a semiconductor light emitting diode (LED) has strengths as a light source in terms of high output, excellent light efficiency and reliability thereof. Therefore, research and development to allow for use of an LED as a high output and high efficiency light source in back light units for display devices and various illumination devices has been actively undertaken.

In order to enable such an LED to be commercialized as a light source for lighting, there is a need to increase light efficiency and reduce manufacturing costs of LEDs while providing high output. However, when increasing a rated current in order to increase speed of light in LED chips having the same area in a high output light emitting diode, light efficiency may be deteriorated due to an increase in a current density, and deterioration thereof may be accelerated due to a heat emission of devices.

On the other hand, in order to relieve the defect described above with respect to a current density, increasing an area of a light emitting diode chip may be considered, but it may be difficult to implement a uniform current density with respect to an entire area and to expect a high production yield.

A method for solving the aforementioned defect may be provided in which an epitaxial layer for an LED grown on a single substrate is implemented as a plurality of LED cells through an isolation process, and the plurality of LED cells are interconnected with one another. In this method, however, since an area of the epitaxial layer removed in the isolation process is increased, an effective light emission area, that is, an area of an active layer, may be significantly reduced.

SUMMARY OF THE DISCLOSURE

An aspect of the present disclosure provides a semiconductor light emitting device having a multi-cell array and a method of manufacturing the same, capable of improving light efficiency by significantly reducing a reduction in an effective light emission area due to an isolation process.

According to an aspect of the present disclosure, there is provided a method of manufacturing a semiconductor light emitting device having a multi-cell array, the method including: sequentially forming a first conductive semiconductor layer, an active layer and a second conductive semiconductor layer on a substrate; etching and removing portions of the second conductive semiconductor layer and the active layer so as to expose portions of an upper surface of the first conductive semiconductor layer corresponding to respective regions of the second conductive semiconductor layer spaced apart from one another; and separating light emitting cells from the substrate by partially etching the exposed portions of the first conductive semiconductor layer, wherein the separating of the light emitting cells through the etching of the first conductive semiconductor layer is not performed at an edge portion of the substrate.

The partial etching of the exposed portions of the first conductive semiconductor layer may be performed to expose the substrate.

The partial etching of the exposed portions of the first conductive semiconductor layer may be performed using inductive coupled plasma-reactive ion etching (ICP-RIE).

The substrate may be a sapphire ($Al_2O_3$) substrate, a silicon (Si) substrate, or a semiconductor growth substrate formed of at least one material selected from the group consisting of SiC, $MgAl_2O_4$, MgO, $LiAlO_2$, $LiGaO_2$ and GaN.

The substrate may include a plurality of convex portions formed on an upper surface thereof.

The method may further include forming a transparent electrode on an upper surface of the second conductive semiconductor layer.

The transparent electrode may be formed of a transparent conductive material.

The transparent conductive material may be indium tin oxide (ITO) or zinc oxide (ZnO).

The method may further include forming a first electrode on the exposed portion of the first conductive semiconductor layer and forming a second electrode on the second conductive semiconductor layer.

The method may further include forming the first electrode on the exposed portion of the first conductive semiconductor layer and forming a second electrode on the transparent electrode.

According to another aspect of the present disclosure, there is provided a semiconductor light emitting device including: a substrate; and a plurality of light emitting cells formed on the substrate and divided by an isolation region, each light emitting cell including a first conductive semiconductor layer, an active layer and a second conductive semiconductor layer, wherein in side portions of a light emitting cell disposed on an edge portion of the substrate among the plurality of light emitting cells, a side portion thereof opposed to a different light emitting cell is inclined to be gentler than a side portion thereof not opposed to the different light emitting cell.

The substrate may be a sapphire ($Al_2O_3$) substrate, a silicon (Si) substrate, or a semiconductor growth substrate formed of at least one material selected from the group consisting of SiC, $MgAl_2O_4$, MgO, $LiAlO_2$, $LiGaO_2$ and GaN.

The substrate may include a plurality of convex portions formed on an upper surface thereof.

The semiconductor light emitting device may further include a transparent electrode formed on an upper surface of the second conductive semiconductor layer.

The transparent electrode may be formed of a transparent conductive material.

The transparent conductive material may be indium tin oxide (ITO) or zinc oxide (ZnO).

The semiconductor light emitting device may further include a first electrode formed on the first conductive semiconductor layer and a second electrode formed on the second conductive semiconductor layer.

The semiconductor light emitting device may further include a first electrode formed on the first conductive semiconductor layer and a second electrode formed on the transparent electrode.

According to another aspect of the present disclosure, there is provided a semiconductor light emitting device including: a substrate; and a plurality of light emitting cells formed on the substrate, each light emitting cell including a first conductive semiconductor layer, an active layer and a second conductive semiconductor layer, wherein at least one of the plurality of light emitting cells includes a first side surface and a second side surface, the first side surface forming a first internal angle with the substrate and the second side surface forming a second internal angle with the substrate different from the first internal angle.

The at least one of the plurality of light emitting cells may be arranged on an outer periphery of the substrate.

The first side surface may face another one of the plurality of light emitting cells and the second side surface may face away from the another one of the plurality of light emitting cells.

The second internal angle may be greater than the first internal angle.

Adjacent light emitting cells may be separated from each other by an isolation region.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE DISCLOSURE

Figure 1:
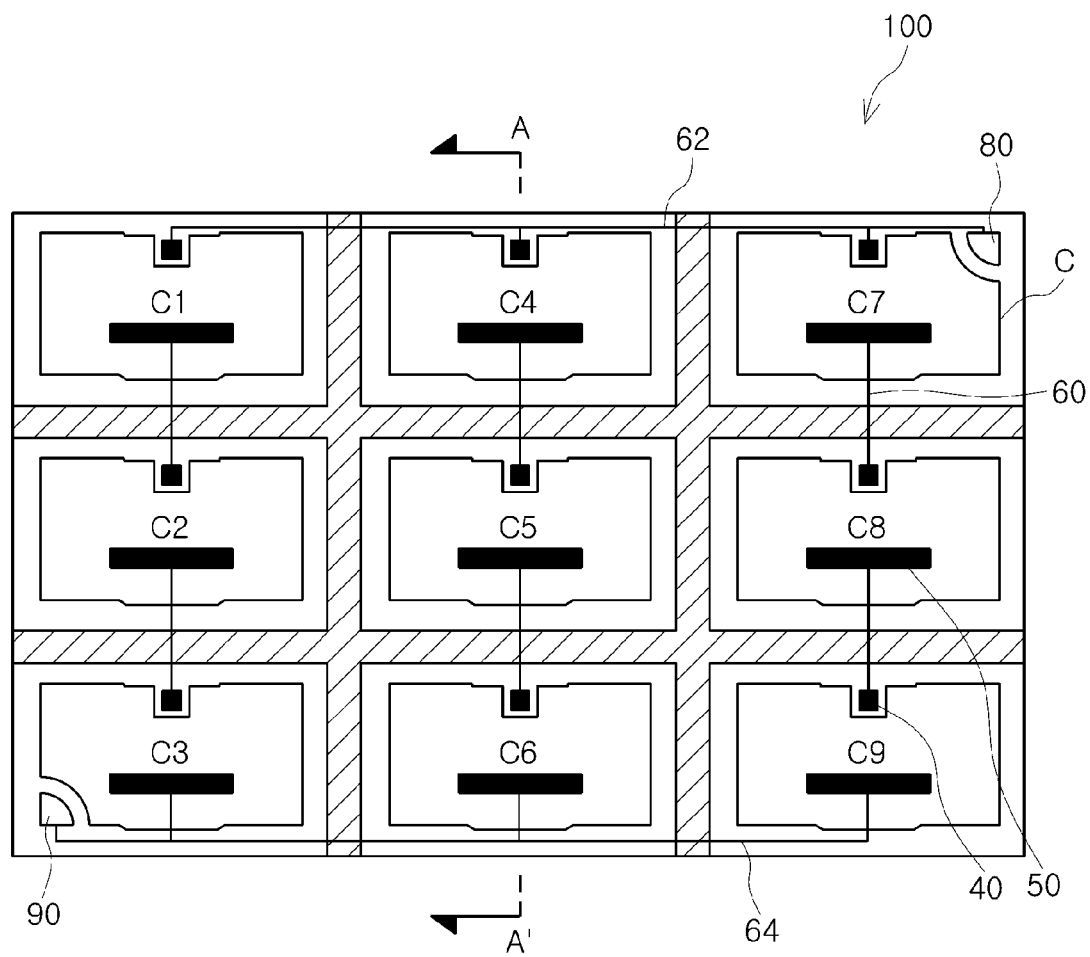
FIG. 1 is a top plan view of a semiconductor light emitting device having a multi-cell array according to an exemplary embodiment of the present disclosure.

Hereinafter, exemplary embodiments of the present disclosure will be described in detail with reference to the accompanying drawings. The disclosure may, however, be embodied in many different forms and should not be construed as being limited to the exemplary embodiments set forth herein. Rather, these exemplary embodiments are provided so that this disclosure will be thorough and complete, and will fully convey a scope of the disclosure to those having ordinary skill in the art.

In the drawings, the shapes and dimensions of elements may be exaggerated for clarity, and the same reference numerals will be used throughout to designate the same or like elements.

A semiconductor light emitting device and a method of manufacturing the same according to an exemplary embodiment of the present disclosure will be described with reference to the accompanying drawings.

Figure 2:
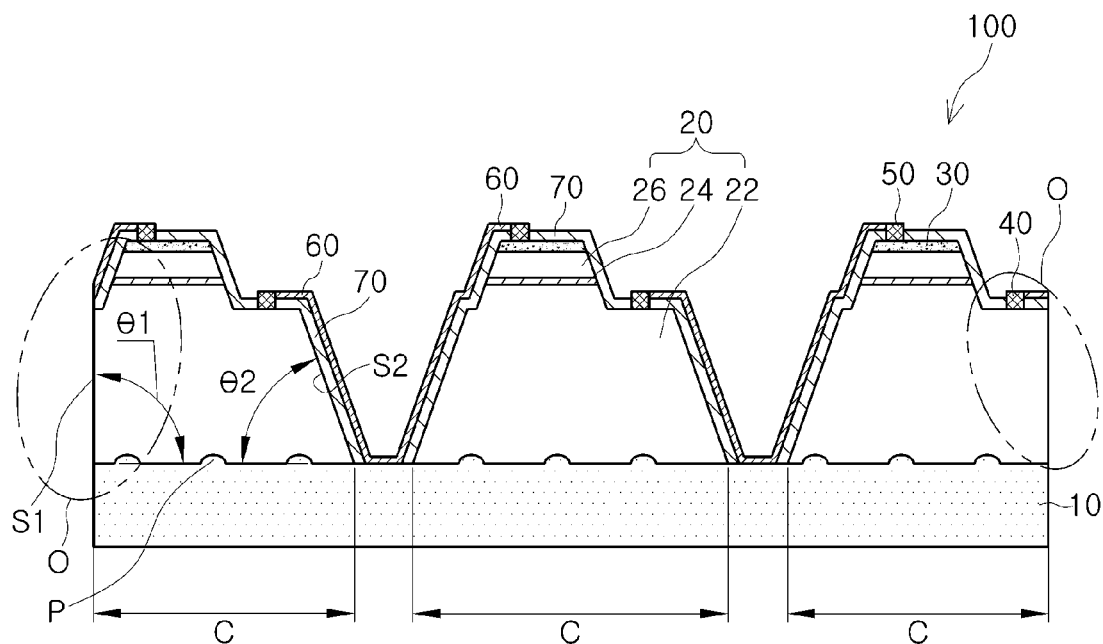
FIG. 2 is a side cross-sectional view of the semiconductor light emitting device having a multi-cell array taken along line A-A' of FIG. 1.
Figure 3:
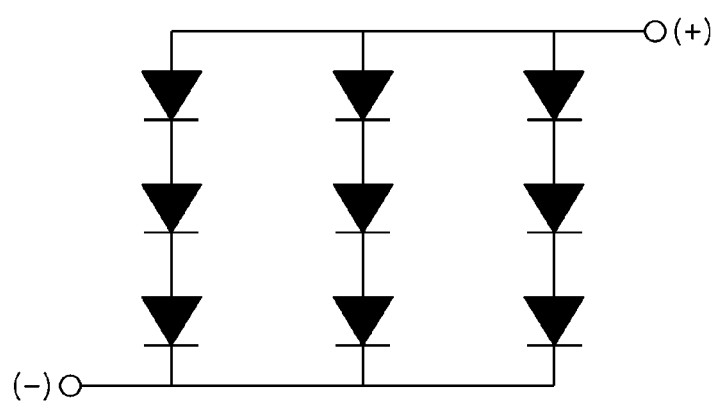
FIG. 3 is an equivalent circuit diagram of a multi-cell array implemented in the light emitting device of FIG. 1.

FIG. 1 is a top plan view of a semiconductor light emitting device having a multi-cell array according to an exemplary embodiment of the present disclosure. FIG. 2 is a side cross-sectional view of the semiconductor light emitting device having a multi-cell array taken along line A-A' of FIG. 1. FIG. 3 is an equivalent circuit diagram of the semiconductor light emitting device having a multi-cell array shown in FIG. 1. Portions of components composing the semiconductor light emitting device are omitted in FIGS. 1 and 2 for convenience of explanation.

As shown in FIG. 1, a semiconductor light emitting device 100 according to an exemplary embodiment of the present disclosure may include a substrate 10 (FIG. 2) and a plurality of light emitting cells C arranged in a 3×3 array on an upper surface of the substrate 10.

FIG. 1 shows a structure in which light emitting cells C of each column are connected to one another in series and the light emitting cells C connected in series are connected to one another in parallel. However, the present disclosure is not limited to the connection between the light emitting cells C described above. For example, the present disclosure can be implemented with a serial connection between the light emitting cells C to form one line or a parallel connection therebetween. In addition, various other forms in which both serial and parallel connections are included therein are also embodied by the present disclosure.

The term 'light emitting cell' used herein may refer to a semiconductor multilayer film portion having an active layer region, differentiated from other cells.

The plurality of light emitting cells C may be obtained by separating a semiconductor multilayer film 20 including a first conductive semiconductor layer 22, an active layer 24 and a second conductive semiconductor layer 26 sequentially formed on the substrate 10.

A transparent electrode 30 may be formed on the second conductive semiconductor layer 26.

The substrate 10 may be a substrate on which a nitride semiconductor single crystal can be grown. A sapphire ($Al_2O_3$) substrate, a silicon (Si) substrate, or a growth substrate for a semiconductor formed of at least one material selected from the group consisting of SiC, $MgAl_2O_4$, MgO, $LiAlO_2$, $LiGaO_2$ and GaN, may be used for the substrate 10. In the present exemplary embodiment, a plurality of convex portions P may be formed on the substrate 10. Light extraction efficiency may be improved through the convex portions P.

The first and second conductive semiconductor layers 22 and 26 may respectively be n-type and p-type semiconductor layers and formed of a nitride semiconductor layer. Thus, according to the present exemplary embodiment, the first conductive semiconductor layer 22 may refer to an n-type semiconductor layer and the second conductive semiconductor layer 26 may refer to a p-type semiconductor layer, but they are not limited thereto. The first and second conductive semiconductor layers 22 and 26 may be formed of a material having a compositional formula of $Al_xIn_yGa_{(1-x-y)}N$ ($0 \leq x \leq 1$, $0 \leq y \leq 1$, and $0 \leq x+y \leq 1$), for example, GaN, AlGaN, InGaN, or the like. The active layer 24 disposed between the first and second conductive semiconductor layers 22 and 26 may emit light having a predetermined amount of energy due to electron-hole recombination. Further, the active layer 24 may have a multiple quantum well (MQW) structure in which quantum well layers and quantum barrier layers are alternately stacked on top of each other. In the case of a multiple quantum well (MQW) structure, for example, an InGaN/GaN structure may be used. The semiconductor multilayer film 20 may be an epitaxially grown layer.

The transparent electrode 30 may be formed of a transparent conductive material such as, for example, indium tin oxide (ITO) or zinc oxide (ZnO).

A cell separation process used in the present exemplary embodiment may include partial separation such as a mesa etching process, and complete separation such as an isolation process. The first conductive semiconductor layer 22 may have an exposed region when using partial separation such as the mesa etching process. In addition, complete separation such as the isolation process may be performed by completely removing a portion of the first conductive semiconductor layer 22 exposed through the partial separation such that a surface of the substrate 10 is exposed, resulting in the light emitting cells C being separated from one another.

At the time of the isolation process with respect to the semiconductor light emitting device 100 as described above, a region of the active layer may be partially removed, which leads to a deterioration in light extraction efficiency due to a loss of the active layer. Accordingly, in order to significantly reduce a loss of the active layer at the time of the cell separation process, a side portion of a light emitting cell at an edge portion O of the substrate is not subjected to the isolation process.

As such, the isolation process may not be performed at the edge portion O, such that a loss of the active layer of the light emitting cell C positioned at the edge portion O of the substrate is reduced and thus an entire area of the active layer is increased, whereby light extraction efficiency may be increased and an operating voltage Vf may be reduced.

In addition, since the isolation process is not performed at the edge portion O of the substrate, the size of respective light emitting cells C on a single substrate may be increased.

With reference to FIG. 2, in the respective light emitting cells C, the first conductive semiconductor layer 22 may have a partially exposed region through the mesa etching. A first electrode 40 and a second electrode 50 may be respectively formed on the exposed region of the first conductive semiconductor layer 22 and the transparent electrode 30. In addition, the light emitting cells C may be separated from one another through the isolation process.

Since a side portion of a light emitting cell at the edge portion O of the substrate is not subjected to the isolation process, as shown in FIG. 2, in side portions of the light emitting cell C disposed at the edge portion O, a side portion S1 thereof not opposed to a different light emitting cell C may have an inclination angle θ1 almost vertical to the substrate 10; while in the side portions of the light emitting cell C disposed at the edge portion O, a side portion S2 thereof opposed to a different light emitting cell C may have a relatively gentle inclination angle θ2 with respect to the substrate 10 through the isolation process. That is, in the side portions of the light emitting cell C disposed at the edge portion O, the inclination angle θ1 of the side portion S1 to the substrate 10, not opposed to the different light emitting cell C, may be greater than the inclination angle θ2 of the side portion S2 to the substrate 10 opposed to the different light emitting cell C.

The exemplary embodiment of the present disclosure with reference to FIG. 1 will be described in detail. The first electrode 40 of one light emitting cell C2 and the second electrode 50 of the different light emitting cell C1 adjacent thereto may be connected to each other through an interconnection portion 60.

In addition, in order to prevent a corresponding light emitting cell C from contacting an unnecessary region, the light emitting cell C may have an insulation layer 70 formed on a side surface thereof. The insulation layer 70 may be formed of any one or more of an oxide layer formed of $SiO_2$, $Al2O_3$, or the like, and a nitride layer formed of $Si_3N_4$, SiON or the like. As shown in FIG. 2, the insulation layer 70 may be used as a passivation layer provided on almost an entire side surface of each light emitting cell C. In the present exemplary embodiment, however, in the side portions of the light emitting cell C disposed at the edge portion O of the semiconductor light emitting device 100, the side portion S1 not opposed to the different light emitting cell C may not have the insulation layer 70 thereto.

Meanwhile, the insulation layer 70 is not shown in FIG. 1 to clearly illustrate a correlation between the positions of the electrodes formed on the respective light emitting cells C, the interconnection portions 60 and the transparent electrodes 30.

Light emitting cells C7 and C3 disposed on both ends of a multi-cell array may respectively have first and second bonding pads 80 and 90 formed thereon to be connected to a corresponding polarity electrode.

In detail, electrodes of the light emitting cells C1 to C9 may be connected to the first and second bonding pads 80 and 90 through first and second connection portions 62 and 64.

The first and second bonding pads 80 and 90 may be formed of a metal different from that of the first and second connection portions 62 and 64 and the interconnection portion 60. For example, the bonding pads 80 and 90 may be configured of a general metal layer formed of, for example, chromium/gold (Cr/Au), and the first and second connection portions 62 and 64 and the interconnection portion 60 may be formed of a metal having excellent reflectivity and conductivity, for example, aluminium (Al), silver (Ag), or the like.

Unlike the description above, the first and second bonding pads 80 and 90, the first and second connection portions 62 and 64, and the interconnection portion 60, may also be formed using a single metal pattern forming process.

That is, the first and second bonding pads 80 and 90, the first and second connection portions 62 and 64, and the interconnection portion 60 may all be formed of the same metal, for example, chromium/gold (Cr/Au).

According to the exemplary embodiment of the present disclosure, if the isolation process is not performed at the edge portion O during a cell separation process, the active layer region of the light emitting cell C positioned at the edge portion O may be increased to improve light extraction efficiency and to reduce an operating voltage accordingly.

In addition, since the isolation process is not performed at the edge portion O, the size of respective light emitting cells C on a single substrate may be increased.

FIGS. 4 to 8 are cross-sectional views of respective processes for explaining a method of manufacturing a semiconductor light emitting device having a multi-cell array according to an exemplary embodiment of the present disclosure.

Figure 4:
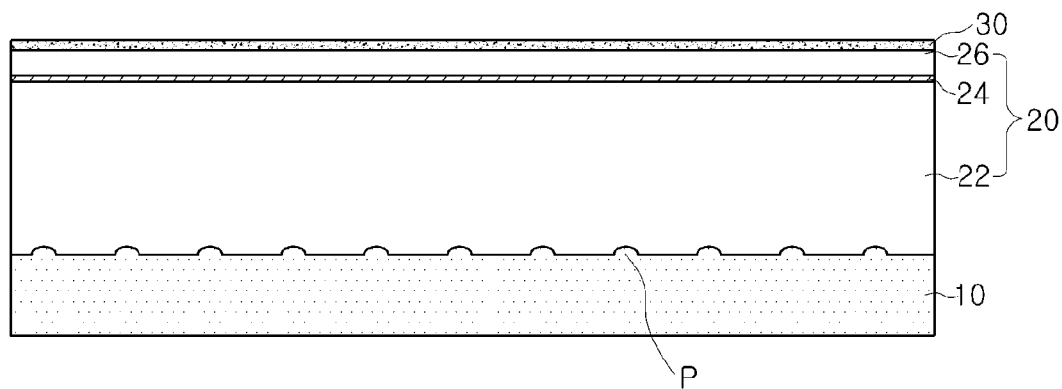
FIGS. 4 to 8 are cross-sectional views of respective processes for explaining a method of manufacturing a semiconductor light emitting device having a multi-cell array according to an exemplary embodiment of the present disclosure.

First, as shown in FIG. 4, the first conductive semiconductor layer 22, the active layer 24, and the second conductive semiconductor layer 26 may be sequentially grown on the growth substrate 10 by using at least one semiconductor growth process such as, for example, metal organic chemical vapor deposition (MOCVD), hydride vapor phase epitaxy (HVPE), molecular beam epitaxy (MBE), or the like, by which the semiconductor multilayer film 20 may be formed on the substrate 10.

The plurality of convex portions P may be formed on the substrate 10. Light extraction efficiency may be improved using the convex portions.

The transparent electrode 30 may be formed on the second conductive semiconductor layer 26. Here, the transparent electrode 30 may be formed of a transparent conductive material such as, for example, ITO or ZnO.

Figure 5:
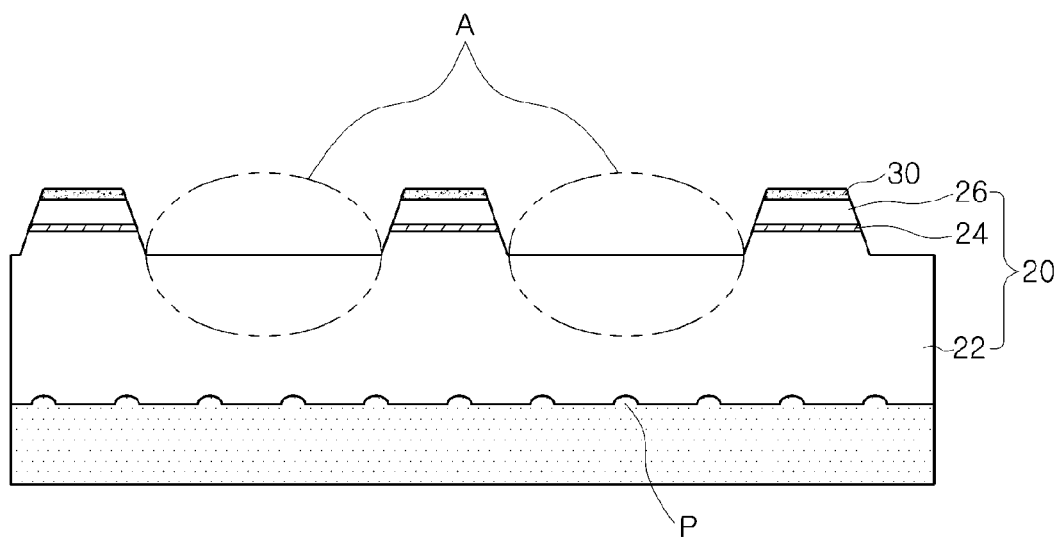

Subsequently, as shown in FIG. 5, an exposed region A formed through the partial separation, e.g., a mesa etching process, may be provided in the first conductive semiconductor layer 22.

Figure 6:
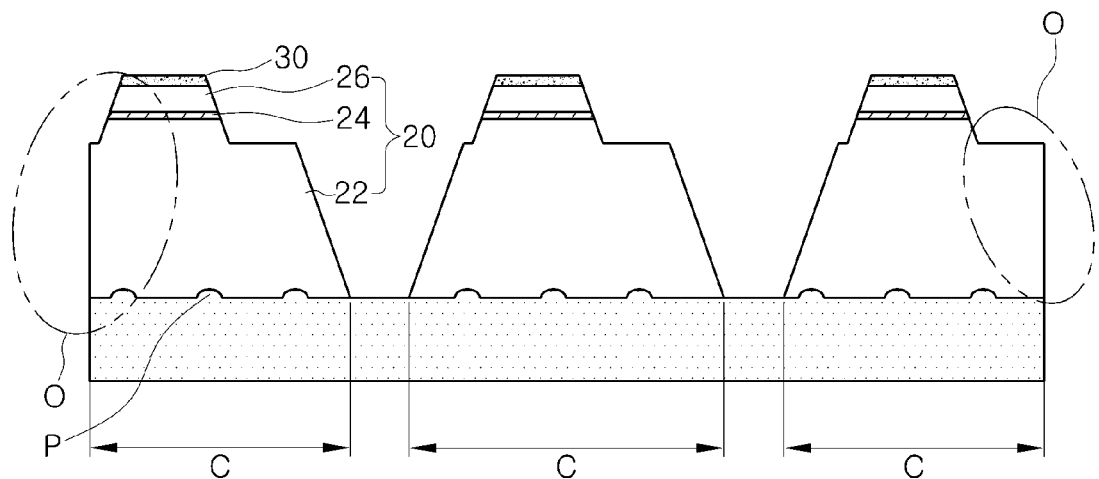

Then, as shown in FIG. 6, a plurality of separated light emitting cells C may be obtained by removing a region between respective light emitting cells C in a cell separation process. In this case, the separation process performed between cells may include an etching process, for example, inductive coupled plasma-reactive ion etching (ICP-RIE) or the like, through which a surface of the substrate 10 can be exposed.

However, according to the exemplary embodiment of the present disclosure, a side portion of a light emitting cell at the edge portion O of the substrate may not be subjected to the isolation process in order to significantly reduce a loss of the active layer region at the time of a cell separation process.

Figure 7:
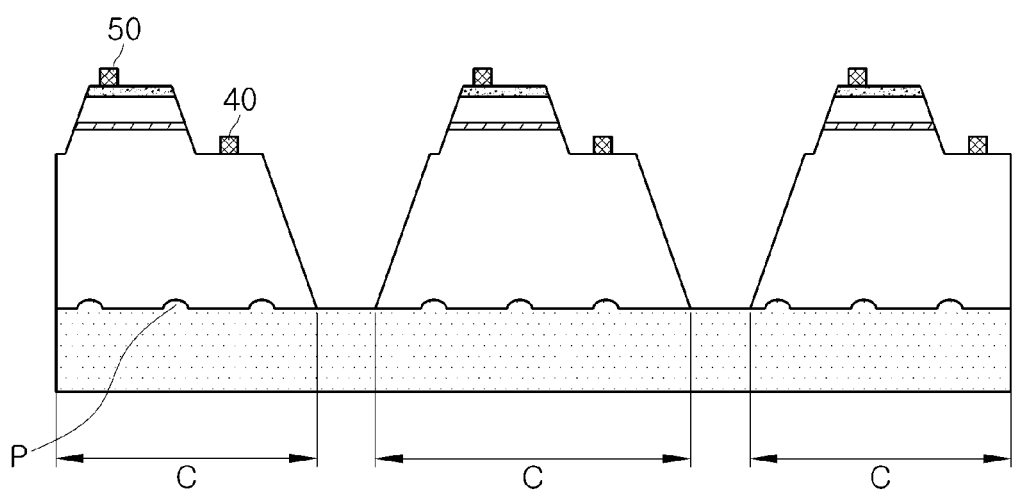

Subsequently, as shown in FIG. 7, the first and second electrodes 40 and 50 may be respectively formed on the exposed first conductive semiconductor layer 22 and the transparent electrode 30 of each light emitting cell C. The process of forming the first and second electrodes 40 and 50 as described above may be performed simultaneously, but is not limited thereto.

Figure 8:
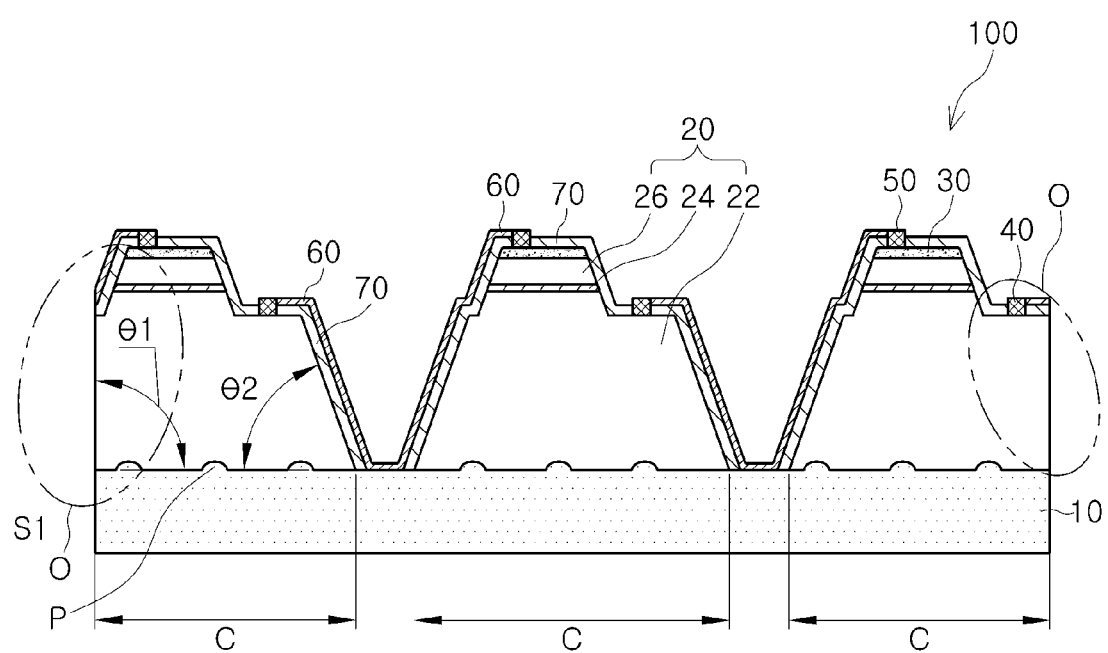

Then, referring to FIG. 8 and FIG. 1, the insulation layer 70 may be formed on the surface of the light emitting cells C1 to C9, and the interconnection portion 60 and the first and second connection portions 62 and 64 may be formed to connect the electrodes of the light emitting cells C1 to C9 to one another, such that the electrodes of the light emitting cells C1 to C9 are connected to the first and second bonding pads 80 and 90, thereby obtaining the semiconductor light emitting device 100 having a multi-cell array shown in FIG. 1.

That is, as shown in FIG. 8, the isolation process may not be performed at the edge portion O at the time of the cell separation process, whereby the size of the active layer region of the light emitting cell C positioned at the edge portion O may be relatively increased to improve light extraction efficiency and to reduce an operating voltage accordingly.

In addition, since the isolation process is not performed at the edge portion O, an effect in which the size of respective light emitting cells C is relatively increased on a single substrate may be provided.

As set forth above, in a semiconductor light emitting device having a multi-cell array and a method of manufacturing the same according to exemplary embodiments of the present disclosure, the reduction of an effective light emission area (e.g., area of an active layer) due to an isolation process may be significantly suppressed by performing an isolation process only between light emitting cells at the time of separation of light emitting cells from a substrate, whereby light efficiency may be improved. In addition, an operating voltage level may be lowered accordingly.

While the present disclosure has been shown and described in connection with the exemplary embodiments thereof, it will be apparent to those having ordinary skill in the art that modifications and variations can be made without departing from the spirit and scope of the disclosure as defined by the appended claims.

What is claimed is:

1. A semiconductor light emitting device comprising:
    a substrate; and
    a plurality of light emitting cells formed on the substrate and divided by an isolation region, each light emitting cell including a first conductive semiconductor layer, an active layer and a second conductive semiconductor layer,
    wherein in side portions of a light emitting cell disposed on an edge portion of the substrate among the plurality of light emitting cells, a side portion of the light emitting cell not opposed to the different light emitting cell is substantially parallel to a side portion of the substrate and an inclination angle of a side portion of the light emitting cell opposed to a different light emitting cell is smaller than an inclination angle of the side portion of the light emitting cell not opposed to the different light emitting cell.

2. The semiconductor light emitting device of claim 1, wherein the substrate is a sapphire ($Al_2O_3$) substrate, a silicon (Si) substrate, or a semiconductor growth substrate formed of at least one material selected from the group consisting of SiC, $MgAl_2O_4$, MgO, $LiAlO_2$, $LiGaO_2$ and GaN.

3. The semiconductor light emitting device of claim 1 further comprising a transparent electrode formed on an upper surface of the second conductive semiconductor layer.

4. A semiconductor light emitting device comprising:
    a substrate;
    a plurality of light emitting cells formed on the substrate and divided by an isolation region, each light emitting cell including a first conductive semiconductor layer, an active layer and a second conductive semiconductor layer; and
    a first electrode formed on the first conductive semiconductor layer and a second electrode formed on the second conductive semiconductor layer,
    wherein in side portions of a light emitting cell disposed on an edge portion of the substrate among the plurality of light emitting cells, an inclination angle of a side portion of the light emitting cell opposed to a different light emitting cell is smaller than an inclination angle of a side portion of the light emitting cell not opposed to the different light emitting cell.

5. The semiconductor light emitting device of claim 3, further comprising a first electrode formed on the first conductive semiconductor layer and a second electrode formed on the transparent electrode.

6. A semiconductor light emitting device comprising:
    a substrate; and
    a plurality of light emitting cells formed on a top surface of the substrate, each light emitting cell including a first conductive semiconductor layer, an active layer and a second conductive semiconductor layer,
    wherein all light emitting cells arranged on an outer periphery of the substrate include a first side surface facing another light emitting cell of the plurality of light emitting cells and a second side surface not facing another light emitting cell of the plurality of light emitting cells, the first side surface forming a first internal angle with the top surface of the substrate and the second side surface forming a second internal angle with the top surface of the substrate that is greater than the first internal angle.

7. The semiconductor light emitting device of claim 6, wherein adjacent light emitting cells are separated from each other by an isolation region.

8. The semiconductor light emitting device of claim 1, wherein the side portion of the light emitting cell not opposed to the different light emitting cell is coplanar with the side portion of the substrate.

9. The semiconductor light emitting device of claim 6, wherein the second side surface of the light emitting cell is coplanar with the side surface of the substrate.

10. The semiconductor light emitting device of claim 6, wherein the substrate is a sapphire ($Al_2O_3$) substrate, a silicon (Si) substrate, or a semiconductor growth substrate formed of at least one material selected from the group consisting of SiC, $MgAl_2O_4$, MgO, $LiAlO_2$, $LiGaO_2$ and GaN.

11. The semiconductor light emitting device of claim 6, further comprising a transparent electrode formed on an upper surface of the second conductive semiconductor layer.

12. The semiconductor light emitting device of claim 6, further comprising a first electrode formed on the first conductive semiconductor layer and a second electrode formed on the second conductive semiconductor layer.

13. The semiconductor light emitting device of claim 11, further comprising a first electrode formed on the first conductive semiconductor layer and a second electrode formed on the transparent electrode.

\* \* \* \* \*